United States Patent [19]

Dion

[11] Patent Number: 4,944,850

[45] Date of Patent: Jul. 31, 1990

[54] TAPE AUTOMATED BONDED (TAB) CIRCUIT AND METHOD FOR MAKING THE SAME

[75] Inventor: John H. Dion, Corvallis, Oreg.

[73] Assignee: Hewlett-Packard Company, Palo Alto, Calif.

[21] Appl. No.: 454,808

[22] Filed: Dec. 18, 1989

[51] Int. Cl.⁵ ............................................. C25D 5/02
[52] U.S. Cl. .................................... 204/15; 29/827
[58] Field of Search .................. 204/15; 29/827, 838, 29/847, 853

[56] References Cited

U.S. PATENT DOCUMENTS 4,380,042 4/1983 Angelucci, Sr. et al. .......... 361/421
4,806,409 2/1989 Walter .................................. 29/827

OTHER PUBLICATIONS

Dixon, T., "TAB Technology Tackles High-Density Interconnections", *Electronic Packaging and Production*, pp. 35-39 (Dec. 1984).
Cain, R., "Beam Tape Carriers—A Design Guide", *Solid State Technology*, (Mar. 1978).
Rima, P., "The Basics of Tape Automated Bonding", *Hybrid Circuit Technology*, pp. 15-21 (Nov. 1984).
Hoffman, P., "Tab Implementation and Trends", *Solid State Technology*, pp. 85-88 (Jun. 1988).
Holzinger, S., Report delivered at EXPO SMT 1986 (Rogers Corporation) entitled "Tab Types and Materials".
*Metal Finishing*, Michael Murphy, editor, Metals and Plastic Publications, Hackensack, N.J., vol. 83, No. 1A (Jan. 1985).
Lowenheim, F. A., *Electroplating: Fundamentals of Surface Finishing*, McGraw-Hill, Inc., 1978.

Primary Examiner—T. M. Tufariello

[57] ABSTRACT

Improved TAB circuit and method for producing the same. Specifically, new methods and materials are used to electro-plate and test TAB circuits. A typical TAB circuit includes a substrate having a plurality of conductive traces thereon, each trace terminating in a lead. All of the leads extend inwardly into a window through the substrate. To short the leads for electro-plating, a metal conductive portion is provided within the window which is attached to the leads. The conductive portion may consist of a separate unit secured to the leads, or may be integrally formed with the leads as a single unit. Testing of the traces for opens is accomplished by running a current from the conductive portion to the opposite end of each trace. For short testing, the conductive portion is easily severed from all of the leads using a punch assembly or the like.

19 Claims, 2 Drawing Sheets

TAPE AUTOMATED BONDED (TAB) CIRCUIT AND METHOD FOR MAKING THE SAME

Background of the Invention

The present invention generally relates to tape automated bonded (TAB) circuits, and more particularly to an improved method for the metal plating of TAB circuits, along with a procedure for testing the plated product.

The rapid development of new and advanced microelectronic devices has created a corresponding need for improved circuit mounting structures. One type of circuit mounting structure currently in use is called a tape automated bonded circuit, commonly known as a "TAB" circuit.

TAB circuits were first researched and developed in the mid-1960's. As discussed in Rima, P. W., "The Basics of Tape Automated Bonding", *Hybrid Circuit Technology*, November, 1984, pps. 15-21, a TAB circuit is constructed using a thin film carrier tape which is typically stored on large reels. The tape has a variable width of between 8 and 70 mm, and is approximately 5 mils thick. The length of each portion of tape used to form an individual circuit package is selectively variable, depending on the type of circuit to be made. The tape may be manufactured from a variety of different dielectric materials, including polyimide, and/or epoxy-glass compositions. Polyimide is preferred in that it has a high degree of mechanical strength, is capable of withstanding relatively high temperatures, and has a high coefficient of linear expansion similar to that of copper. It also has a relatively low coefficient of moisture absorption (about 3%).

There are numerous methods which may be used to construct TAB circuits. One method (known as the "three layer process") involves the use of a thin, conductive foil preferably manufactured of copper or copper alloy which is bonded to the tape using an adhesive known in the art. The foil is approximately 1.4 mils thick in a preferred embodiment. In addition, an opening or window is physically formed through the center of each portion or "frame" of tape by chemical etching or other conventional means, including the use of a punch and die assembly. The foil is then etched to produce a conductive printed circuit pattern having beam-type inner leads which extend into the window.

In an alternative construction method commonly known as the "two layer process", a base layer of metal (e.g., copper) is directly sputtered or otherwise deposited onto the tape. Next, the tape substrate is run through an electroless bath of metal (e.g., copper) which deposits a very thin layer of metal onto the substrate surface and first metal layer. After window formation as described above, the top layer of metal is covered with a thin layer of photoresist which is imaged and developed, leaving an exposed metal pattern. The patterned substrate is passed through an electrolytic bath where a further metal layer is plated onto the exposed metal pattern. Resist materials are applied and subsequently etched to produce the completed product, as discussed in Dixon, T., "TAB Technology Tackles High Density Interconnections", *Electronic Packaging and Production*, pp. 34-39 (December, 1984).

As noted above, the metal used to create the circuit pattern normally involves copper or a copper alloy. These materials have tendency to corrode which may adversely affect the operational capabilities of the circuit. To prevent surface corrosion, the circuit pattern is normally plated with a non-corrosive metal (e.g., gold, palladium, and/or rhodium.) In a preferred embodiment, the non-corrosive metal is electro-plated onto the circuit pattern. Electro-plating is a conventional process, which is normally accomplished by immersion of the circuit into a bath of metal solution, followed by the application of a current to the circuit. Simultaneously with the application of current to the circuit, a current of opposite charge is applied to the metal solution. As a result, metal from the solution is plated onto the circuit. So that electrical current may be applied to the circuit as described above, all of the circuit traces must be shorted together to ensure complete plating.

After plating, a selected electronic device (e.g., an IC) is positioned within the window and secured therein by bonding the inner leads of the circuit to contact regions on the device.

However, as early as possible during the production process, it is important to test the TAB circuit for two parameters: 1) electrical opens, and 2) electrical shorts. Electrical open testing determines if there is a continuous conductive pathway from one end of each circuit trace to the other end. Electrical short testing determines if there are two or more traces which are shorted together. Electrical shorting can occur during the trace-defining process described above. Specifically, if a bridge of metal remains between two or more traces, a short will occur.

However, testing of the TAB circuit for shorts and opens is traditionally a difficult and labor-intensive process. For example, to test for opens, physical contact must be made with both ends of each trace. This includes the end of the trace extending into the window (e.g., the lead.) Since the leads are thin and delicate, they are subject to damage (physical deformation.) As a result, open testing is either avoided entirely, or is completed after the electronic device is applied to the circuit. If an open is detected after attachment of the electronic device, the entire unit (including the device) must be discarded.

To test for shorts, all of the traces which were shorted during the electro-plating procedure must be unshorted. Traditional unshorting methods described herein require that the individual TAB circuits be removed from the long strip used in the manufacturing process. Again, this is a time-consuming and labor-intensive process.

The present invention represents a new and improved method for electro-plating the traces in a TAB circuit. The method offers a greater degree of efficiency compared with prior plating methods, and greatly simplifies the testing procedures described above.

Summary of the Invention

It is an object of the invention to provide an improved TAB circuit and method for making the same.

It is another object of the invention to provide an improved TAB circuit and method for making the same which uses a new and efficient electro-plating procedure.

It is another object of the invention to provide an improved TAB circuit and method for making the same which uses a new and efficient electro-plating procedure in which the circuit traces are electrically shorted in a highly efficient manner.

It is a further object of the invention to provide an improved TAB circuit and method for making the same in which the circuit is readily tested for electrical shorts and opens.

In accordance with the foregoing objects, the present invention specifically involves an improved electro-plating method for TAB circuit trace patterns which facilitates subsequent testing of the circuit. A typical TAB circuit includes a substrate having a plurality of conductive traces thereon, each trace terminating in an individual lead. All of the leads extend inwardly into an open region or "window" through the substrate. The window is designed to receive an integrated circuit (IC) or other device which is electrically connected to the trace leads.

To electro-plate the traces and leads prior to attachment of the electronic device, all of the traces must be shorted together. To accomplish this in accordance with the invention, the leads extending into the window are all connected together. In one embodiment, the trace pattern of the TAB circuit is formed so that part of the pattern includes a conductive region positioned within the window. The conductive region is integrally connected to the leads since they are both formed in a single step as a unitary structure. To test for electrical opens, contact does not have to be made with each lead as described above, but instead can made to the conductive region at a distance away from the leads. This minimizes the possibility of damage to the leads. To test for shorts, the conductive region is subsequently removed in a single step, preferably using a punch assembly or similar apparatus.

In an alternative embodiment, the leads are attached to a separate portion of conductive material sized for placement within the window of the TAB circuit. To unshort the leads for testing purposes, a punch press or the like is again used to sever the leads from the portion of conductive material.

The techniques described herein facilitate the electro-plating/testing processes, and represent an advance in the art of TAB circuit design. These and other objects, features, and advantages of the invention shall be described below in the following Detailed Description of a Preferred Embodiment and Drawings included herewith.

Detailed Description of a Preferred Embodiment

Figure 1:
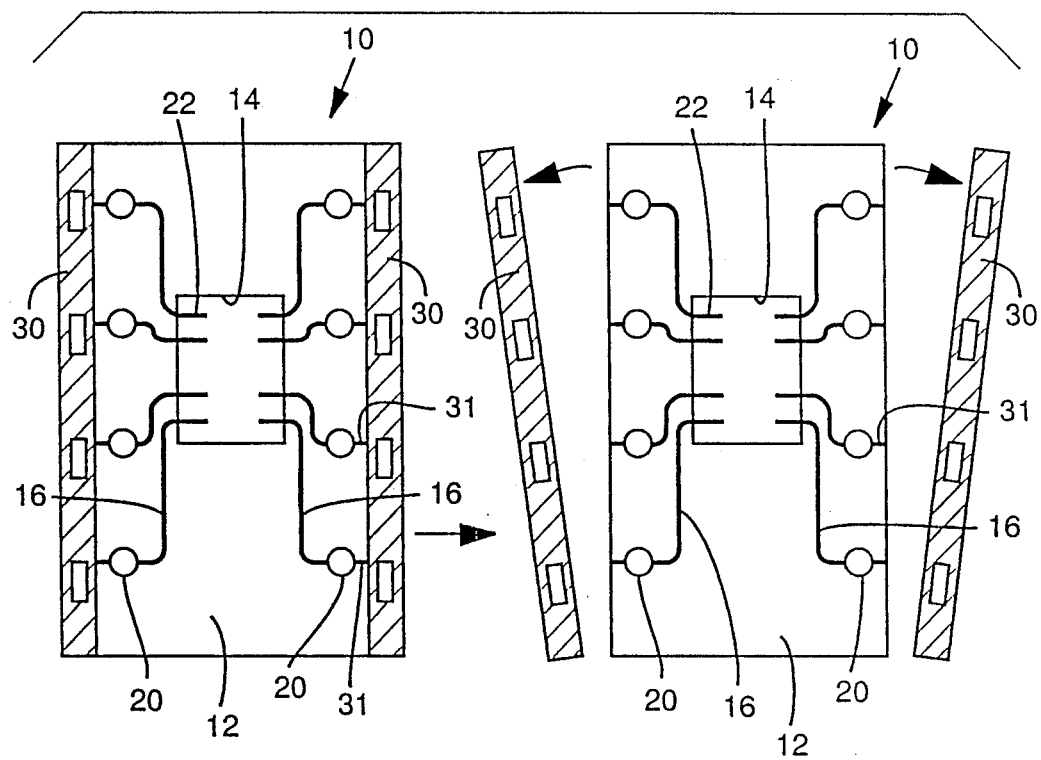
FIG. 1 is a top view of a TAB circuit produced using conventional materials and methods.

The present invention involves an improved method for electro-plating and testing a TAB circuit. With reference to FIG. 1, a typical TAB circuit 10 is illustrated. The circuit 10 includes a tape substrate 12 preferably manufactured of polyester, polyimide, or epoxy-glass compositions. The tape substrate 12 includes a window 14 therethrough of selectively variable size. The window 14 is sized to receive an integrated circuit (IC) or other electronic device (not shown).

The tape substrate 12 also includes at least one conductive metal layer in the form of a trace pattern 16 thereon. The trace pattern 16 is typically formed through the attachment of a thin conductive metal foil to the substrate 12 (e.g., 1.4 mil thick copper) using an adhesive known in the art. The foil is then etched using conventional techniques to produce the trace pattern 16. Formation of the trace pattern is described in greater detail in Rima, P. W., "The Basics of Tape Automated Bonding", *Hybrid Circuit Technology*, November, 1984, pps. 15–21. However, there are alternative ways to produce the trace pattern 16 as noted above, and the invention shall not be limited to one specific method.

With continued reference to FIG. 1, the trace pattern 16 includes a selectively variable quantity of conductive pads 20, each pad 20 being conductively connected to a lead 22. The pads 20 communicate with leads 22 through individual traces which comprise the trace pattern 16. As shown in FIG. 1, the leads 22 extend outwardly into the window 14. In a preferred embodiment, each lead 22 is approximately 0.01 inch wide and extends into the window 14 by about 0.038 inch, although these values may be varied as desired. The leads 22 are adapted for subsequent attachment to an IC or other comparable device.

Since the leads 22 and trace pattern 16 are normally manufactured of copper (or other metal subject to corrosion), a protective coating of substantially inert metal (e.g., gold) is traditionally applied thereto. This is normally accomplished by electro-plating processes known in the art which basically involve immersing the trace pattern 16 in a selected metal solution, applying a current to the pattern, and applying a current of opposite charge to the solution. This results in the plating of metal from the solution onto the trace pattern 16. As indicated above, electro-plating is a conventional process. The actual electrical currents used and metal solutions involved may be selectively varied in accordance with numerous factors, including the size of the circuit, the materials used to form the circuit, the desired application for which the circuit is intended, etc. Basic techniques for electro-plating which are applicable to the present invention are described in *Metal Finishing*, Michael Murphy-editor, Metals and Plastics Publications, Hackensack, N.J., Vol. 83, No. 1A (January, 1985); and Lowenheim, F. A., *Electroplating: Fundamentals of Surface Finishing*, McGraw-Hill, Inc., 1978. Accordingly, the invention shall not be limited to any specific electro-plating procedure, and a variety of known processes may be used.

To accomplish electro-plating of the trace pattern 16, all of the individual traces must be shorted together so that current may flow therethrough. FIG. 1 illustrates a method for shorting the traces in accordance with prior art techniques. Specifically, bus strips 30 are provided as an integral part of the tape substrate 12. The bus strips 30 are coated with a conductive metal (e.g. the same metal used to make the trace pattern 16), and electrically communicate through conductive pathways 31 with each of the pads 20. The bus strips 30 enable all of the traces in the trace pattern 16 to be shorted together for electro-plating purposes.

However, to test the circuit 10 for opens after electro-plating and before attachment of the selected electronic device, contact must be made with the leads 22 as previously described. Frequently, this causes physical deformation of the leads 22 which creates problems during the subsequent stages of circuit manufacture. For this reason, open testing is usually not done until after the device is mounted to the TAB circuit.

To test for shorts, the bus strips 30 must be physically removed from the circuit 10 in order to unshort the traces. This is accomplished by trimming off the bus strips 30 as indicated in FIG. 1.

Use of the bus strips 30 requires the tape substrate 12 to be physically larger in order to accommodate the trace architecture necessary to connect the trace pattern 16 to the bus strips 30. Also, the individual TAB circuits 10 are normally attached together in a long strip as noted above. This procedure greatly facilitates handling of the circuits 10. However, in order to remove the bus strips 30 from the individual TAB circuits 10, each of the circuits 10 must be separated from the strip which reduces production efficiency.

Figure 2:
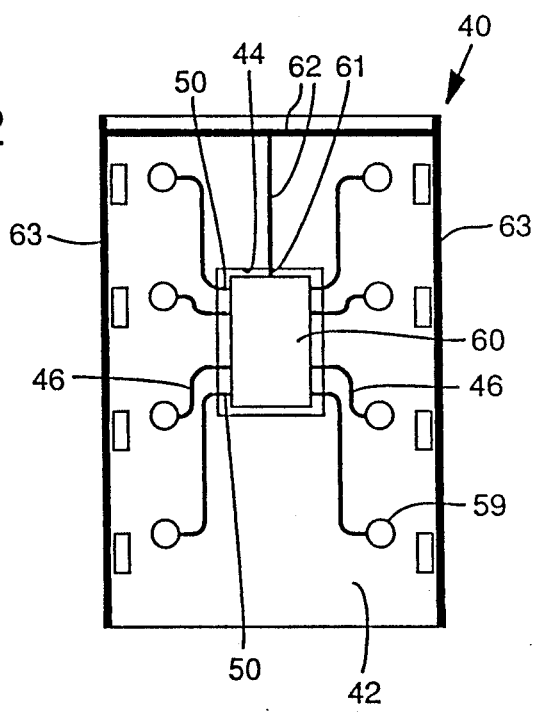
FIG. 2 is a top view of a TAB circuit produced using the methods and materials of the present invention.

The present invention represents an improved method for shorting the electrical traces of a TAB circuit. With reference to FIG. 2, one embodiment of the invention is schematically illustrated. A TAB circuit 40 is shown having a tape substrate 42, window 44, and a pattern of traces 46. The materials used to form the TAB circuit 40 are the same as those used to construct the TAB circuit 10 of FIG. 1 with one exception. Specifically, in the region of window 44, traces 46 each terminate at one end in a lead 50. All of the leads 50 are integrally attached to a substantially planar conductive portion 60 which occupies most of the window 44 as illustrated in FIG. 2. The leads 50 are preferably longer than those shown in FIG. 1 (about 10% longer). The opposite end of each trace 46 terminates in a conductive pad 59.

In a preferred embodiment, the conductive portion 60 is connected via a lead 61 and conductive pathway 62 to a thin conductive line 63 along each side of the substrate 42. The line 63 extends along the entire length of each circuit 40 in order to conductively connect all of the circuits in the strip together so that electro-plating may be done on a mass production basis.

The conductive portion 60, leads 50, conductive pathway 62 and line 63 are all formed as a single, integral structure during the trace defining process. For example, when the traces 46 are produced (either by the use of etched foil or the like), the leads 50 and conductive portion 60 are formed as a unitary structure, with the conductive portion 60 being sized for receipt within the confines of window 44.

In the structure of FIG. 2, all of the leads 50 are effectively shorted and conductively communicate with each other through the conductive portion 60. The conductive portion 60 remains in position over the window 44 throughout the electro-plating process. This enables electrical current to flow through all of the traces 46 for rapid and efficient electro-plating.

After electro-plating of the traces 46, the circuit 40 is tested for opens and shorts. Open testing is accomplished for each trace by testing for electrical continuity from any one of the pads 59 to the conductive portion 60. Individual contact with the leads 50 is not required, and a test current may be applied anywhere on the conductive portion 60, preferably away from the leads 50 to prevent damage thereto. This procedure enables all of the multiple circuits on the entire strip to be tested without separation therefrom. Also, each circuit may be tested before an electronic device is attached.

Figure 4:
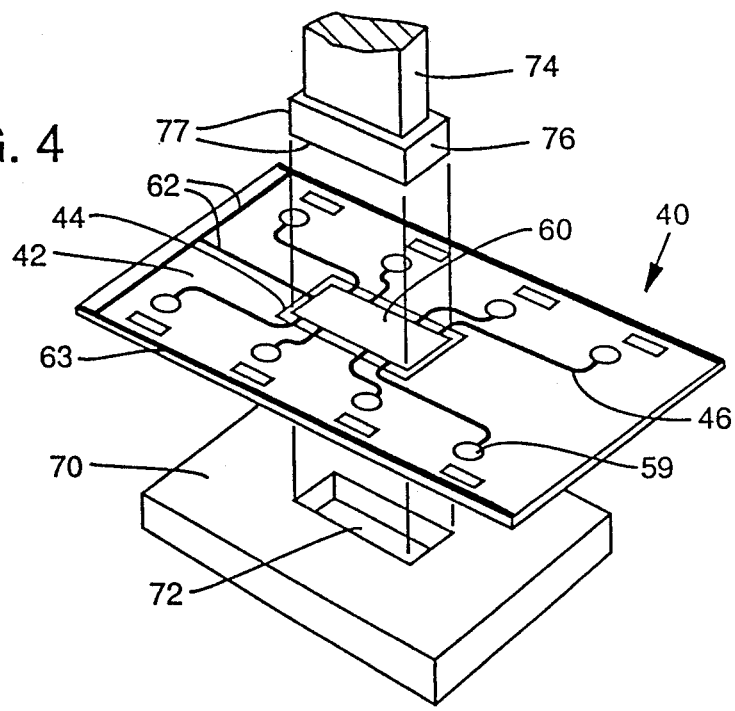
FIG. 4 is a perspective view of a punch and die apparatus usable in accordance with the invention.

Short testing involves checking for electrical continuity from one trace to other traces immediately adjacent thereto. In most cases, each trace has one adjacent trace to the left, and one to the right. If current flows from one trace to an adjacent trace, a short exists. However, to test for shorts, the conductive portion 60 (which was previously used to short the traces) must be removed. To accomplish removal, the use of an appropriately sized punch and die set is preferred. An exemplary punch and die set is shown in FIG. 4.

Specifically, the punch and die set includes a rigid die 70 having an opening 72 therethrough. Also provided is a punch member 74 having a head 76 which preferably includes sharp right angle edges 77. The head 76 is sized to pass through the opening 72 of the die 70. In accordance with the invention, the circuit 40 is placed against the die 70, with the conductive portion 60 being directly aligned with (over or under) the opening 72 which is physically larger than the conductive portion 60. In the embodiment of FIG. 4, the head 76 is then urged toward the conductive portion 60 which severs the portion 60 from leads 50 and pushes portion 60 through the opening 72 for disposal. In this manner, the conductive portion 60 can be removed in a single operation, thereby unshorting the leads 50 in a rapid and efficient manner. Also, the possibility of physical damage to the leads 50 is minimized while enabling the unshorting process to take place with the TAB circuits in strip form. Finally, use of the materials and procedures described above enables the overall size of the TAB circuit to be smaller, since the trace geometry associated with the bus strips 30 of FIG. 1 is not required. This reduces production costs, and enables more TAB circuits to be placed on a single storage/dispensing reel.

Figure 3:
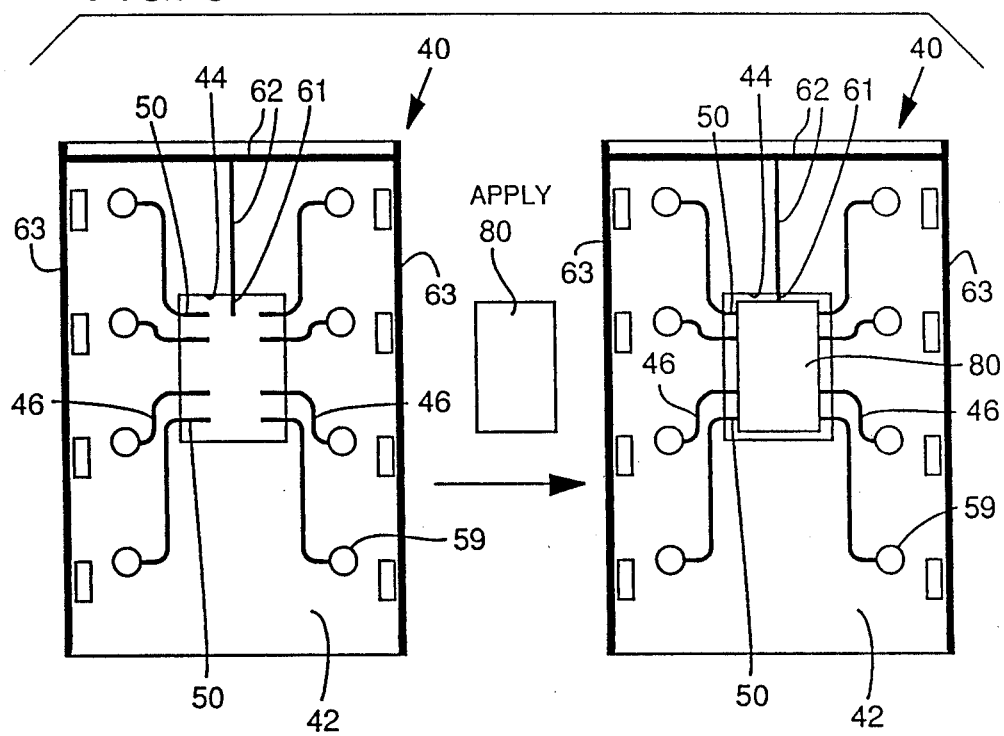
FIG. 3 is a top view of a TAB circuit produced in accordance with an alternative embodiment of the invention.

An alternative embodiment of the invention is illustrated in FIG. 3. All of the components and materials described above relative to the embodiment of FIG. 2 remain the same, with one exception. Specifically, the conductive portion 60 is not included. To short the leads 50 for electro-plating, a shorting panel 80 made of conductive metal (e.g., copper) is secured to the ends of the leads 50 and to lead 61 by welding, soldering, or other conventional processes. In a preferred embodiment, the panel 80 is smaller than the window 44 so that it may be appropriately attached to the leads 50. Also, the leads 50 are slightly longer than those shown in FIG. 1 (e.g., about 10% longer) so that the attachment and detachment thereof relative to panel 80 is facilitated. For testing purposes, lead detachment may be accomplished using the punch and die process described above, or by selective heating if solder is used to secure the panel 80 in position.

The present invention as described herein represents an improved method for electro-plating and subsequent testing of TAB circuits. It offers a higher degree of production efficiency compared with previously-used processes, and minimizes costs associated with TAB circuit construction.

Having herein described preferred embodiments of the invention, it is anticipated that suitable modifications may be made thereto by individuals skilled in the art within the scope of the invention. Accordingly, the invention shall only be construed relative to the following claims:

I claim:

1. A method of manufacturing a tape automated bonded circuit comprising:
   providing a flexible substrate having at least one conductive metal layer thereon and an opening therethrough;

selectively removing portions of said metal layer to form a pattern of conductive traces on said substrate, said pattern terminating in a plurality of leads which extend into said opening;

leaving a region of said metal layer intact over said opening, said region being smaller than said opening and conductively connected to all of said leads in order to short said leads together for the electro-plating thereof; and electro-plating a metal coating onto said pattern of conductive traces, said region of said metal layer remaining in position over said opening during said electro-plating.

2. The method of claim 1 further comprising the step of detaching said region of said metal layer from said leads after said electro-plating.

3. The method of claim 2 wherein said detaching of said region of said metal layer from said leads comprises the step of severing all of said leads from said region.

4. The method of claim 3 wherein said severing of all of said leads from said region of said metal layer comprises the steps of:

providing a punch press assembly comprising a support structure having a bore therethrough, said bore being larger in size than said region of said metal layer, and a punch member sized to pass through said bore of said support structure;

positioning said substrate against said support structure with said region of said metal layer being placed in alignment with said bore; and urging said punch member toward said bore and against said region of said metal layer so as to sever said region from said leads.

5. A method of manufacturing a tape automated bonded circuit comprising:

providing a flexible substrate having at least one conductive metal layer thereon and an opening therethrough;

selectively removing portions of said metal layer to form a pattern of conductive traces on said substrate, said pattern terminating in a plurality of leads which extend into said opening;

securing a conductive metal member to said leads, said conductive metal member being smaller than said opening through said substrate and positioned therein, said conductive metal member being connected to all of said leads in order to short said leads together for the electro-plating thereof; and electro-plating a metal coating onto said pattern of conductive traces, said conductive metal member remaining in position over said opening during said electro-plating.

6. The method of claim 5 wherein said conductive metal member is secured to said leads by the soldering of said leads thereto.

7. The method of claim 5 wherein said conductive metal member is secured to said leads by the welding of said leads thereto.

8. The method of claim 5 further comprising the step of detaching said conductive metal member from said leads after said electro-plating.

9. The method of claim 8 wherein said detaching of said conductive metal member from said leads comprises the step of severing all of said leads from said member.

10. The method of claim 9 wherein said severing of all of said leads from said conductive metal member comprises the steps of:

providing a punch press assembly comprising a support structure having a bore therethrough, said bore being larger in size than said conductive metal member, and a punch member sized to pass through said bore of said support structure;

positioning said substrate against said support structure with said conductive metal member being placed in alignment with said bore; and urging said punch member toward said bore and against said conductive metal member so as to sever said conductive metal member from said leads.

11. A method of manufacturing a tape automated bonded circuit comprising:

providing a flexible substrate having at least one conductive metal layer thereon and an opening therethrough;

selectively removing portions of said metal layer to form a pattern of conductive traces on said substrate terminating in a plurality of leads extending into said opening, each of said traces having first and second ends, said second end of each trace comprising one of said leads;

leaving a region of said metal layer intact over said opening, said region being smaller than said opening and conductively connected to all of said leads in order to short said leads together;

electro-plating a metal coating onto said pattern of conductive traces, said region of said metal layer remaining in position over said opening during said electro-plating;

applying an electrical current to said circuit; and determining if said current flows between said first end of each of said traces and said region, said flow of current therebetween indicating that each of said traces has no open sections therein.

12. A method of manufacturing a tape automated bonded circuit comprising:

providing a flexible substrate having at least one conductive metal layer thereon and an opening therethrough;

selectively removing portions of said metal layer to form a pattern of conductive traces on said substrate terminating in a plurality of leads extending into said opening, each of said traces having first and second ends, said second end of each of said traces comprising one of said leads;

leaving a region of said metal layer intact over said opening, said region being smaller than said opening and conductively connected to all of said leads in order to short said leads together;

electro-plating a metal coating onto said pattern of conductive traces, said region of said metal layer remaining in position over said opening during said electro-plating;

detaching said region of said metal layer from said leads;

applying an electrical current to at least one selected trace in said pattern; and determining if said current is present in any traces adjacent to said selected trace, whereby the presence of said current in any traces adjacent to said selected trace indicates the presence of electrical shorts in said circuit.

13. The method of claim 12 wherein said detaching of said region of said metal layer from said leads comprises the step of severing all of said leads from said region.

14. The method of claim 13 wherein said severing of all of said leads from said region of said metal layer comprises the steps of:
- providing a punch press assembly comprising a support structure having a bore therethrough, said bore being larger in size than said region of said metal layer, and a punch member sized to pass through said bore of said support structure;
- positioning said substrate against said support structure with said region of said metal layer being placed in alignment with said bore; and
- urging said punch member toward said bore and against said region of said metal layer so as to sever said region from said leads.

15. A method of manufacturing a tape automated bonded circuit comprising:
- providing a flexible substrate having at least one conductive metal layer thereon and an opening therethrough
- selectively removing portions of said metal layer to form a pattern of conductive traces on said substrate terminating in a plurality of leads extending into said opening, each of said traces having first and second ends, said second end of each of said traces comprising one of said leads;
- securing a conductive metal member to said leads, said conductive metal member being smaller than said opening through said substrate and positioned therein, said conductive metal member being connected to all of said leads in order to short all of said leads together for the electro-plating thereof;
- electro-plating a metal coating onto said pattern of conductive traces, said conductive metal member remaining in position over said opening during said electro-plating;
- applying an electrical current to said circuit; and
- determining if said current flows between said first end of each of said traces and said region, said flow of said current therebetween indicating that each of said traces has no open sections therein.

16. A method of manufacturing a tape automated bonded circuit comprising:
- providing a flexible substrate having at least one conductive metal layer thereon and an opening therethrough;
- selectively removing portions of said metal layer to form a pattern of conductive traces on said substrate terminating in a plurality of leads extending into said opening, each of said traces having first and second ends, said second end of each of said traces comprising one of said leads;
- securing a conductive metal member to said leads, said conductive metal member being smaller than said opening through said substrate and positioned therein, said conductive metal member being connected to all of said leads in order to short all of said leads together for the electro-plating thereof;
- electro-plating a metal coating onto said pattern of conductive traces, said conductive metal member remaining in position over said opening during said electro-plating;
- detaching said conductive metal member from said leads;
- applying an electrical current to at least one selected trace in said pattern; and
- determining if said current is present in any traces adjacent to said selected trace, whereby the presence of said current in any traces adjacent to said selected trace indicates the presence of electrical shorts in said circuit.

17. The method of claim 16 wherein said detaching of said conductive metal member from said leads comprises the step of severing all of said leads from said member.

18. The method of claim 17 wherein said severing of all of said leads from said conductive metal member comprises the steps of:
- providing a punch press assembly comprising a support structure having a bore therethrough, said bore being larger in size than said conductive metal member, and a punch member sized to pass through said bore of said support structure;
- positioning said substrate against said support structure with said conductive metal member being placed in alignment with said bore; and
- urging said punch member toward said bore and against said conductive metal member so as to sever said conductive metal member from said leads.

19. A method of manufacturing a tape automated bonded circuit comprising:
- providing a flexible substrate having at least one conductive metal layer thereon and an opening therethrough;
- selectively removing portions of said metal layer to form a pattern of conductive traces on said substrate terminating in a plurality of leads extending into said opening, each of said traces having first and second ends, said second end of each of said traces comprising one of said leads, each of said leads being shorted together in said opening by a conductive metal section;
- electro-plating a metal coating onto said metal layer, said conductive metal section remaining in position over said opening during said electro-plating;
- applying an electrical current to said circuit;
- determining if said current flows between said first end of each of said traces and said conductive metal section, said flow of said current therebetween indicating that each of said traces has no open zones therein;
- providing a punch press assembly comprising a support structure having a bore therethrough, said bore being larger in size than said conductive metal section, and a punch member sized to pass through said bore of said support structure;
- positioning said substrate against said support structure with said conductive metal section being placed in alignment with said bore;
- urging said punch member toward said bore and against said conductive metal section so as to sever said conductive metal section from said leads;
- applying an electrical current to at least one selected trace in said pattern; and
- determining if said current is present in any traces adjacent to said selected trace, whereby the presence of said current in any traces adjacent to said selected trace indicates the presence of electrical shorts in said circuit.

* * * * *